(12) United States Patent
Beyer et al.

(10) Patent No.: US 10,283,490 B2
(45) Date of Patent: May 7, 2019

(54) COMMUNICATING OPTICAL SIGNALS BETWEEN STACKED DIES

(71) Applicant: GLOBALFOUNDRIES Inc., Grand Cayman (KY)

(72) Inventors: Sven Beyer, Dresden (DE); Jan Hoentschel, Dresden (DE); Alexander Ebermann, Dresden (DE)

(73) Assignee: GLOBALFOUNDRIES Inc., Grand Cayman (KY)

(*) Notice: Subject to any disclaimer, the term of this patent is extended or adjusted under 35 U.S.C. 154(b) by 15 days.

(21) Appl. No.: 15/713,064

(22) Filed: Sep. 22, 2017

(65) Prior Publication Data

US 2018/0012877 A1 Jan. 11, 2018

Related U.S. Application Data

(62) Division of application No. 14/803,466, filed on Jul. 20, 2015, now Pat. No. 9,806,067.

(51) Int. Cl.
*H01L 25/16* (2006.01)
*H01L 23/48* (2006.01)
(Continued)

(52) U.S. Cl.
CPC ...... *H01L 25/167* (2013.01); *H01L 21/76898* (2013.01); *H01L 23/481* (2013.01);
(Continued)

(58) Field of Classification Search
None
See application file for complete search history.

(56) References Cited

U.S. PATENT DOCUMENTS

2009/0067851 A1* 3/2009 Krishnamoorthy ........................ H01L 25/0652 398/164
2009/0114927 A1* 5/2009 Cho ........................ G02B 6/43 257/84
(Continued)

FOREIGN PATENT DOCUMENTS

TW 535299 B 6/2003
WO 02/06877 A2 1/2002

OTHER PUBLICATIONS

Taiwanese Examination Report dated Jan. 10, 2017 for Taiwan patent application No. 105115045.

*Primary Examiner* — Daniel Whalen
(74) *Attorney, Agent, or Firm* — Amerson Law Firm, PLLC

(57) ABSTRACT

A method includes forming a stack of semiconductor die. The stack includes a first semiconductor die, a second semiconductor die and a third semiconductor die. The first semiconductor die is stacked above the second semiconductor die and the third semiconductor die is stacked above the first semiconductor die. A first optical transmitter and a first optical receiver are provided in the first semiconductor die, a second optical transmitter is provided in the second semiconductor die, and a second optical receiver is provided in the third semiconductor die. A first optical signal is transmitted from the first optical transmitter in the first semiconductor die to the second optical receiver in the third semiconductor die. A second optical signal is transmitted from the second optical transmitter in the second semiconductor die to the first optical receiver in the first semiconductor die.

15 Claims, 6 Drawing Sheets

(51) Int. Cl.
    *H01L 23/00*     (2006.01)
    *H01L 21/768*     (2006.01)
    *H01L 25/04*     (2014.01)

(52) U.S. Cl.
    CPC .............. *H01L 24/16* (2013.01); *H01L 24/83* (2013.01); *H01L 25/043* (2013.01); *H01L 2224/16146* (2013.01); *H01L 2224/818* (2013.01); *H01L 2924/12041* (2013.01); *H01L 2924/12043* (2013.01); *H01L 2924/12044* (2013.01)

(56) References Cited

U.S. PATENT DOCUMENTS

| | | | |
|---|---|---|---|
| 2009/0289265 A1* | 11/2009 | Roozeboom | H01L 25/0657 257/80 |
| 2010/0267176 A1 | 10/2010 | Liu et al. | |
| 2012/0205672 A1 | 8/2012 | Seo et al. | |
| 2014/0268980 A1* | 9/2014 | Kim | G11O 5/063 365/64 |
| 2016/0093595 A1 | 3/2016 | Parsa et al. | |

\* cited by examiner

COMMUNICATING OPTICAL SIGNALS BETWEEN STACKED DIES

BACKGROUND OF THE INVENTION

1. Field of the Invention

Generally, the present disclosure relates to the field of manufacturing of integrated circuits and semiconductor devices, and, more particularly, to an integrated circuit product with die-die stacking structures comprising connectors between individual dies and methods of making such structures.

2. Description of the Related Art

The fabrication of advanced integrated circuits, such as CPUs, storage devices, ASICs (application specific integrated circuits) and the like, requires the formation of a large number of circuit elements on a given chip area according to a specified circuit layout. In a wide variety of electronic circuits, field effect transistors represent one important type of circuit element that substantially determines performance of the integrated circuits. Generally, a plurality of process technologies are currently practiced for forming field effect transistors, wherein, for many types of complex circuitry, MOS technology is currently one of the most promising approaches due to the superior characteristics in view of operating speed and/or power consumption and/or cost efficiency. During the fabrication of complex integrated circuits using, for instance, MOS technology, millions of transistors, e.g., N-channel transistors and/or P-channel transistors, are formed on a substrate including a crystalline semiconductor layer. Miniaturization and increase of circuit densities represent ongoing demands.

A conventional die (chip) is usually mounted on some form of substrate, such as a package substrate or a printed circuit board. Electrical connectivity between the die and the underlying substrate or board is established through a variety of conventional mechanisms. In one example, a so-called flip-chip configuration, the active circuitry side of the die is provided with a plurality of electrically conductive balls or bumps that are designed to establish a metallurgical bond with a corresponding plurality of conductor pads positioned on the substrate or circuit board. The die is flipped over and seated with the active circuitry side facing downwards on the underlying substrate.

Recently, stacked die configurations have been developed in order to increase performance and high-density integration of semiconductor devices. Electrical interconnects must be established between the stacked dies. Several conventional techniques for stacking dies have been considered. In one conventional variant, a relatively small semiconductor die is positioned on the bulk semiconductor side of a much larger semiconductor die. Bonding wires are used to establish the electrical conductivity between the upper die and the lower die. The difficulty associated with this approach is that the bonding wires represent relatively long electrical pathways and thus exhibit higher than desired inductance and proportionally slower electrical performance. In addition, the bulk semiconductor side is not available for heat sink mounting.

A so-called multi-chip module (MCM) package is commonly used in the assembly package and electronic devices. Usually, the MCM package mainly comprises at least two chips encapsulated therein so as to upgrade the electrical performance of the package. A first chip carrier is joined "back to back" with a second chip carrier via an insulating adhesive applied on the inactive surface of the first chip mounted on the first chip carrier and the inactive surface of the second chip mounted on the second chip carrier. The two inactive surfaces are bonded together to form a multi-chip module. Both the topmost or upper-most surface and the lower-most surface of the multi-chip module are capable of being electrically connected with other components, thereby eliminating one of the obstacles associated with vertically stacking chips in flip-chip technology and further varying arrangement flexibility of the chips in a package.

In particular, stacked dies may be electrically connected to each other by means of through-silicon vias (TSVs) as illustrated in FIG. 1. FIG. 1 shows a die 10 embedded in a substrate 11. The die 10 comprises two TSVs 12 and 13. The die 10 comprises an active region 14 comprising an integrated circuit. Die bond pads 15 are connected to the active region 14 of the die 10 and to conductors 16. The conductors 16 are connected to bump bond pads 17 in a lower layer of the substrate 11 to which conductive bumps 18 are adhered. In the depicted prior art example, six additional dies 20, 30, 40, 50, 60 and 70 are stacked vertically above the lower most die 10 and each of the additional dies 20, 30, 40, 50, 60 and 70 comprises TSVs and active portions. Electrical connections between the individual dies 10 to 70 are provided by conductive bumps 19. However, as shown in FIG. 1, this design also requires a plurality of external conductors 16 and thus exhibits relatively long electrical pathways for signal transfer.

As already mentioned, in the art, a large variety of die stacking techniques, including a variety of electrical die-die connections, are proposed as, for example, a stack of a relatively small semiconductor die positioned on the bulk semiconductor side of a much larger semiconductor die wherein bonding wires are used to establish the electrical conductivity between the upper die and the lower die. The bonding wires exhibit long electrical pathways and thus a relatively high inductance and low electrical performance. According to another approach, electrical interconnects between upper and lower dies are provided by a plurality of conductor traces that are formed on the bulk silicon side of the lower die. Again, the conductor traces represent relatively high inductance pathways and thus limit speed performance. Furthermore, the bulk silicon side is not available for a heat sink in this approach.

In view of the situation described above, the present disclosure provides techniques of die-die stacking with improved signal transfer from die to die, in particular, with respect to enhanced signaling speed and standardization ability, as compared to the art.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the subject matter disclosed herein relates to die stacking on an integrated circuit product. According to the present disclosure, a die is provided with optical signal transmission and reception means. In one illustrative embodiment, the individual die can communicate with each other via optical signal transmission and reception means. The optical signal path allows for fast data transmission and transmission of large data amounts in a most reliable manner. Die-to-die stacking based on dies with optical signal transmission and reception means may be realized in a highly standardized manner providing high data rates and broad data bandwidths.

In one particular embodiment, a method includes, among other things, forming a stack of semiconductor die. The stack includes a first semiconductor die, a second semiconductor die and a third semiconductor die. The first semiconductor die is stacked above the second semiconductor die and the third semiconductor die is stacked above the first semiconductor die. A first optical transmitter and a first optical receiver are provided in the first semiconductor die, a second optical transmitter is provided in the second semiconductor die, and a second optical receiver is provided in the third semiconductor die. A first optical signal is transmitted from the first optical transmitter in the first semiconductor die to the second optical receiver in the third semiconductor die. A second optical signal is transmitted from the second optical transmitter in the second semiconductor die to the first optical receiver in the first semiconductor die.

Another method includes, among other things, stacking a plurality of semiconductor die. The plurality of semiconductor die includes at least three semiconductor die. A first optical signal is communicated between a second semiconductor die of the plurality of semiconductor die positioned below a first semiconductor die and the first semiconductor die. A second optical signal is communicated between the first semiconductor die and a third semiconductor die of the plurality of semiconductor die positioned above the first semiconductor die.

BRIEF DESCRIPTION OF THE DRAWINGS

The disclosure may be understood by reference to the following description taken in conjunction with the accompanying drawings, in which like reference numerals identify like elements, and in which.

Figure 1:
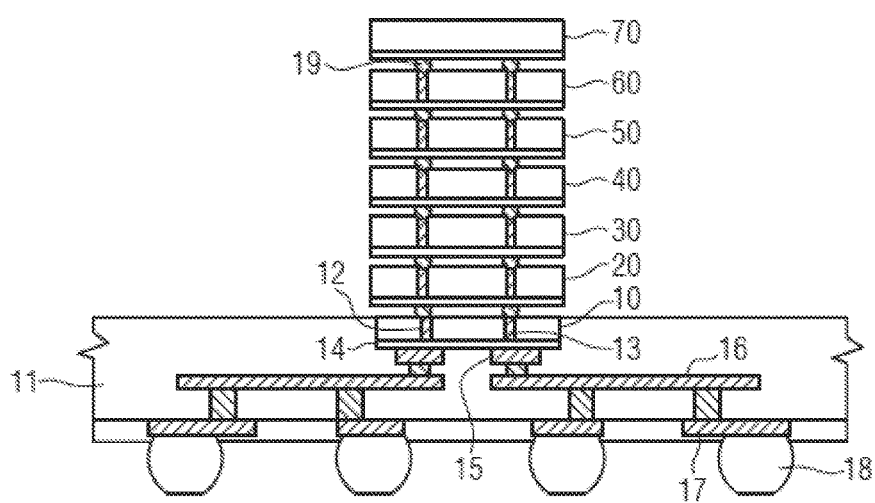
FIG. 1 illustrates die-die stacking with TSVs according to the art.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The following embodiments are described in sufficient detail to enable those skilled in the art to make use of the invention. It is to be understood that other embodiments would be evident, based on the present disclosure, and that system, structure, process or mechanical changes may be made without departing from the scope of the present disclosure. In the following description, numeral-specific details are given to provide a thorough understanding of the disclosure. However, it would be apparent that the embodiments of the disclosure may be practiced without the specific details. In order to avoid obscuring the present disclosure, some well-known circuits, system configurations, structure configurations and process steps are not disclosed in detail.

The present disclosure will now be described with reference to the attached figures. Various structures, systems and devices are schematically depicted in the drawings for purposes of explanation only and so as to not obscure the present disclosure with details which are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary or customary meaning as understood by those skilled in the art, is intended to be implied by consistent usage of the term or phrase herein. To the extent that a term or phrase is intended to have a special meaning, i.e., a meaning other than that understood by skilled artisans, such a special definition shall be expressively set forth in the specification in a definitional manner that directly and unequivocally provides the special definition for the term or phrase.

As will be readily apparent to those skilled in the art upon a complete reading of the present application, the presented techniques are applicable to a variety of technologies, for example, NMOS, PMOS, CMOS, etc., and is readily applicable to a variety of devices, including, but not limited to, logic devices, memory devices, micro-electromechanical systems (MEMS), etc. Generally, manufacturing techniques and semiconductor devices in which N-channel transistors and/or P-channel transistors are formed are described herein. The techniques and technologies described herein may be utilized to fabricate MOS integrated circuit devices, including NMOS integrated circuit devices, PMOS integrated circuit devices and CMOS integrated circuit devices. In particular, the processing steps described herein are utilized in conjunction with any semiconductor device fabrication process that forms gate structures for integrated circuits, including both planar and non-planar integrated circuits. Although the term "MOS" properly refers to a device having a metal gate electrode and an oxide gate insulator, that term is used throughout to refer to any semiconductor device that includes a conductive gate electrode (whether metal or other conductive material) that is positioned over a gate insulator (whether oxide or other insulator), which, in turn, is positioned over a semiconductor substrate.

Figure 2:
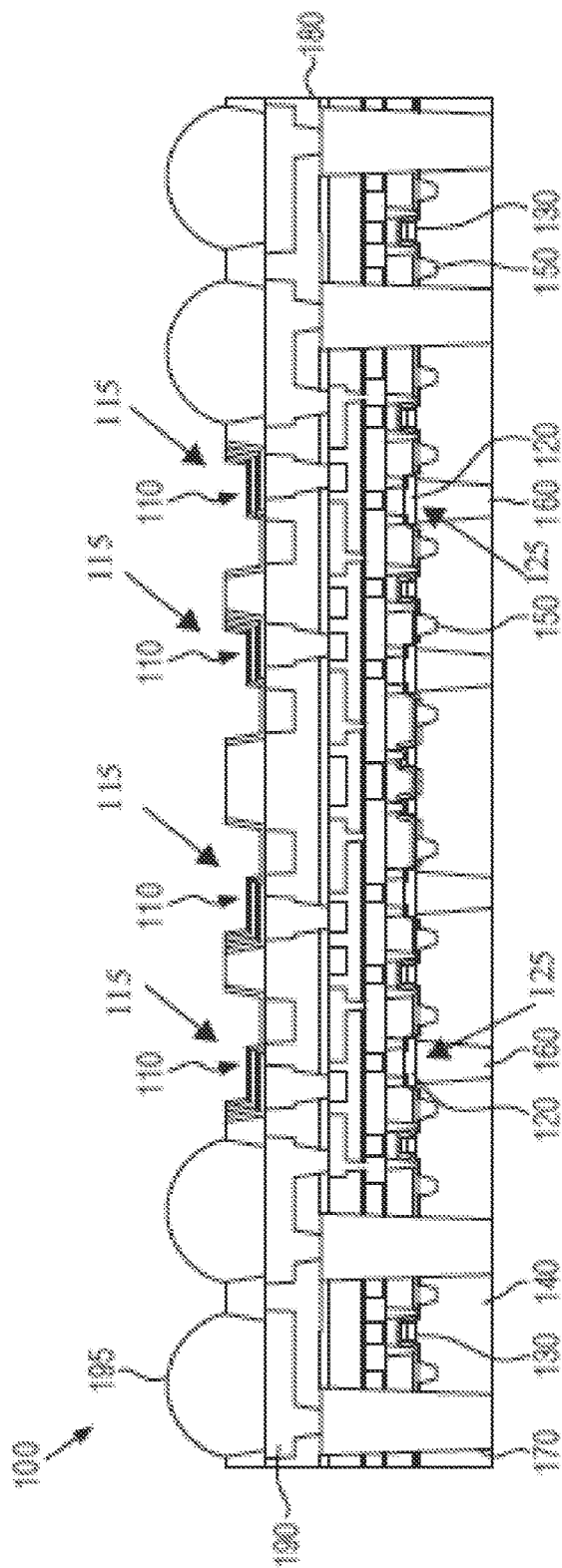
FIG. 2 illustrates a die having an optical transmitter, an optical receiver and TSVs.

The present disclosure provides stacked dies that are equipped with optical transmitters (modulators) comprising, for example, organic LEDs and optical receivers (for example, comprising photo diodes) to communicate which each other (hereinafter referred to generically as "OLEDS"). FIG. 2 illustrates a die 100 equipped with OLEDS 110 for transmitting optical signals and photo diodes 120 for receiving optical signals. Each OLEDS 110 may comprise a light emitting layer sandwiched by (or positioned between) hole and electron transporting layers, hole and electron injecting layers and electrode layers as known in the art. Other means for transmitting and receiving optical signals may be employed as desired. In particular, optical transceivers 115, 125 including the OLEDs 110 or the photo diodes 120 and configured for both transmitting optical signals and receiving optical signals may be employed.

In one illustrative embodiment, the die 100 comprises an active portion (device layer) comprising semiconductor devices as transistor devices 130 formed on and partially in a semiconductor substrate 140. Individual semiconductor devices, for example, transistors 130, are electrically separated from other semiconductor devices, for example, other transistors 130, by means of shallow trench isolators (STIs) 150 formed in the semiconductor substrate 140. It is noted that the semiconductor substrate 140 may comprise a semiconductor layer, which in turn may be comprised of any appropriate semiconductor material, such as silicon, silicon/germanium, silicon/carbon, other II-VI or III-V semiconductor compounds and the like. The semiconductor substrate 140 may be a silicon substrate, in particular, a single crystal silicon substrate. Other materials may be used to form the semiconductor substrate, such as, for example, germanium, silicon germanium, gallium phosphate, gallium arsenide, etc. Furthermore, the semiconductor substrate 140 may define a silicon-on-insulator (SOI) configuration where a thin semiconductor layer, for example, a silicon layer, is formed on a buried oxide layer that is formed in a bulk semiconductor substrate, for example, a bulk silicon substrate.

In one illustrative embodiment, the transistors 130 may be FinFETs. The transistors 130 may be high-k metal gate transistor devices with gate dielectrics exhibiting a dielectric constant ("k") larger than the one of silicon dioxide, for example, k>5. In principle, the transistors 130 may be planar or 3D transistors with a high-k/metal gate (HK/MG) structure formed according to so-called "gate last" or "replacement gate" technique or so-called "gate first" technique. In general, using the "gate first" technique involves forming a stack of layers of material across the substrate, wherein the stack of materials includes a high-k gate insulation layer, one or more metal layers, a layer of polysilicon and a protective cap layer, for example, silicon nitride. Thereafter, one or more etching processes are performed to pattern the stack of materials to thereby define the basic gate structures for the transistor devices. In the replacement gate technique, a so-called "dummy" or sacrificial gate structure is initially formed and remains in place as many process operations are performed to form the device, for example, the formation of doped source/drain regions, performing an anneal process to repair damage to the substrate caused by the ion implantation processes and to activate the implanted dopant materials. At some stage of the process flow, the sacrificial gate structure is removed to define a gate cavity where the final HK/MG gate structure for the device is formed.

As shown in FIG. 2, the photo diodes 120 are formed on or above insulation regions 160. The insulation regions 160 may be formed of the same material as the STIs 150, for example, a silicon dioxide material. The insulation regions 160 may be formed by an additional (with respect to the formation of the STIs 150) patterning sequence comprising the deposition and patterning of a mask layer and etching of the semiconductor substrate 140. As shown in FIG. 2, die 100 is etched on the rear side where the semiconductor substrate 140 is provided in order to form the insulation regions 160. Similarly, through-silicon vias (TSVs) 170 are formed by etching the rear side of the die 100 through the semiconductor substrate 140. The thus etched openings are filled with an electrically conductive material in order to form the TSVs 170. The electrically conductive material may be a conductive metal or metal alloy and may comprise, for example, copper, nickel, silver, gold or platinum. The TSVs 170 may have diameters of about 5-10 micrometers, for example.

A number of metallization layers 180 may be comprised in the die 100. Additional active or passive semiconductor devices may be formed at different levels of the metallization layers 180. The metallization layers 180 may be formed by plating, chemical vapor deposition, physical vapor deposition or the like. The semiconductor devices, including the transistors 130, photo diodes 120, OLEDS 110 and TSVs 170, are electrically connected/contacted by conductive connectors or contacts 190. In one illustrative embodiment, at the top of the die 100, conductive bumps 195 are formed for electrical contact to further devices. The metallization layers 180 may comprise one or more redistribution layers providing electrical pathways between various conductor structures of the die 100 and the conductive bumps 195. The conductive bumps 195 may comprise copper or aluminum, for example, and may be formed by stencil processes or plating. In particular, connections between the conductive bumps 195 and the TSVs 170 are provided for power routing as well as mechanical stability.

Figure 3:
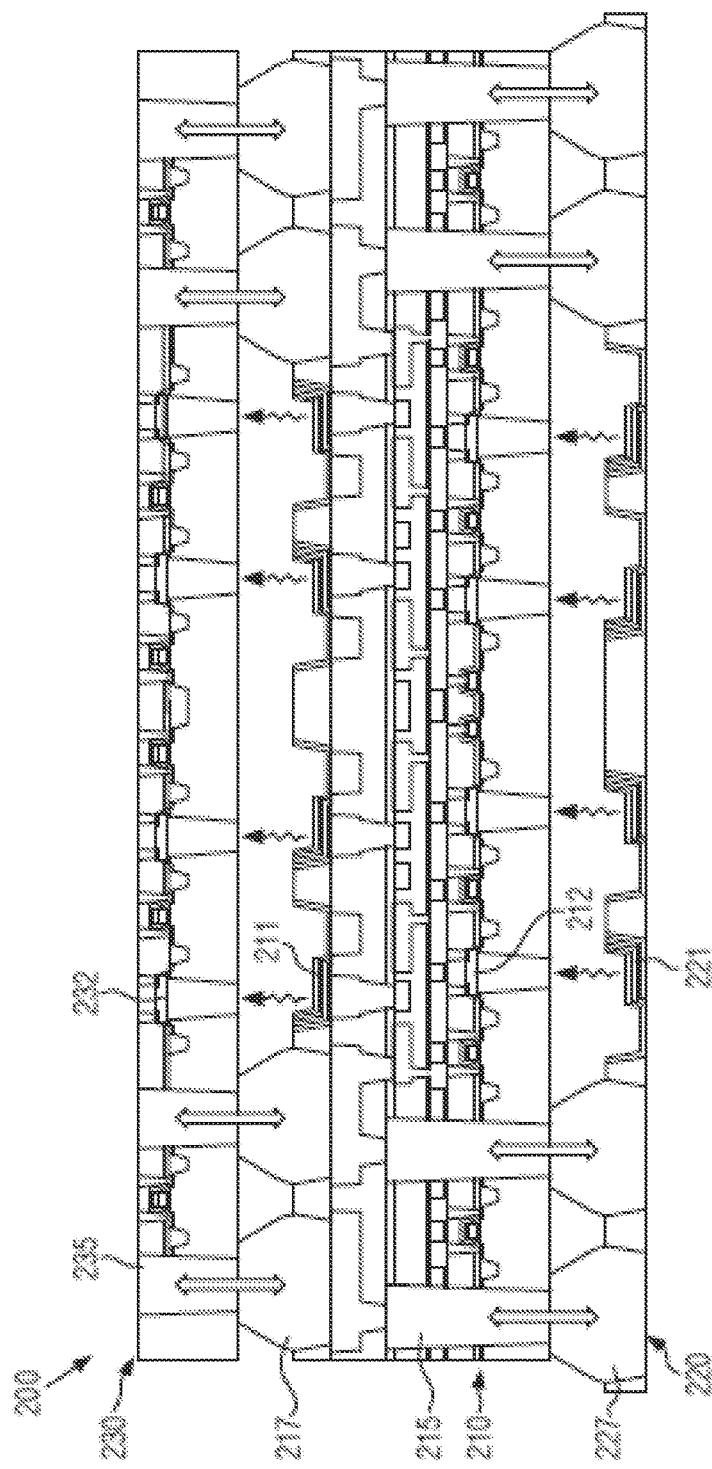
FIG. 3 illustrates a die stack having dies with optical transmitters, optical receivers and TSVs.

A stacked die configuration 200 according to one illustrative embodiment is illustrated in FIG. 3. A die similar to the one shown in FIG. 2 represents one illustrative embodiment of a middle die 210 in FIG. 3. The stacked die configuration 200 further comprises a lower die 220 and an upper die 230. Similar to the middle die 210, the lower die 220 is equipped with optical transmitters 221, for example, in the form of OLEDS, for signaling to the optical receivers (photo diodes) 212 of the middle die 210. In the depicted example, optical signals are schematically illustrated by curved arrows in FIG. 3. Optical transmitters 211 transmit optical signals to optical receiver 232 of the upper die 230. Although not depicted in FIG. 3, the upper die 230 may also comprise optical transmitters and/or the lower die 220 may also comprise optical receivers.

In addition to optical signal connections, the stacked die configuration 200 shown in FIG. 3 is equipped with electric current connections (illustrated by straight double-arrows) between the individual die 210, 220 and 230 that are provided by TSVs 215 and 235 of the middle die 210 and the upper die 230, respectively, and conductive bumps 217 and 227 formed on the upper surface of the middle die 210 and the lower die 220, respectively.

It should be noted that integrated cooling systems, for example, air gaps, water cooling, liquid nitrogen cooling, etc., may be provided in the stacked die configuration 200 shown in FIG. 3 as well as the individual die 100 as shown in FIG. 2. For example, a heat sink can be adhered or thermally connected to the substrate of a die, for example, the bottom part of the semiconductor substrate 140 of the die 100 shown in FIG. 2.

Figure 4:
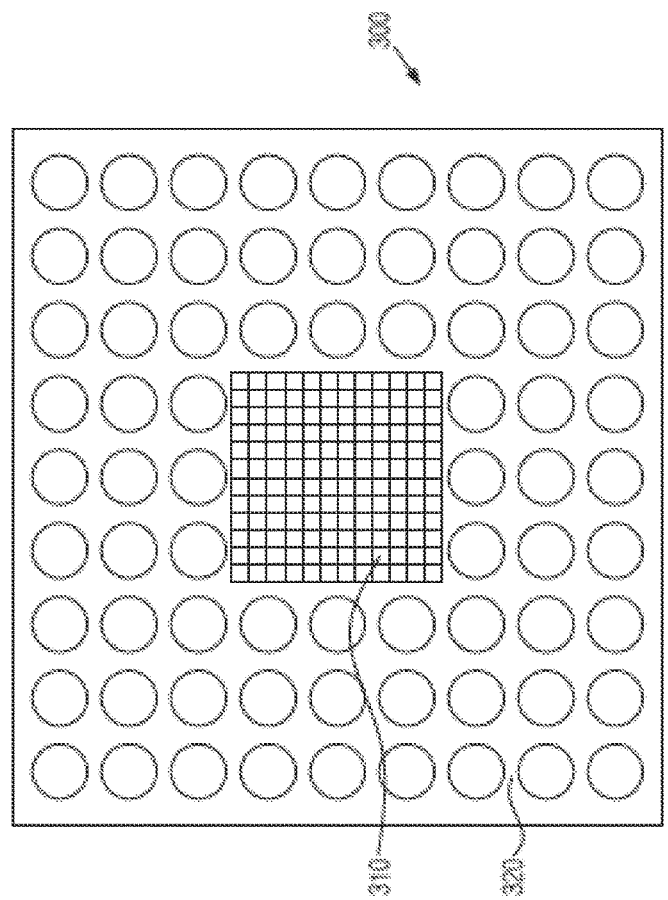
FIG. 4 illustrates a top view of a die with an array of conductive bumps and an array of optical transmitters/receivers.

As already described above, in one illustrative embodiment, a die manufactured in accordance with an embodiment disclosed herein may comprise TSVs and bumps for electrical connections between individual dies and optical connections provided by optical transmitters and receivers. For example, as illustrated in FIG. 4, a die 300 may comprise a central optical array 310 built by optical transmitters/receivers for optical signaling and a bump array 320 framing the optical array 310 for electric current signaling.

In one illustrative embodiment, a die according to an embodiment may comprise a modulation circuitry provided in order to enhance the signal strengths of the optical signaling. Moreover, optical signaling may be improved by accurate alignment of optical transmitters and optical receivers of individual stacked dies.

Figure 5:
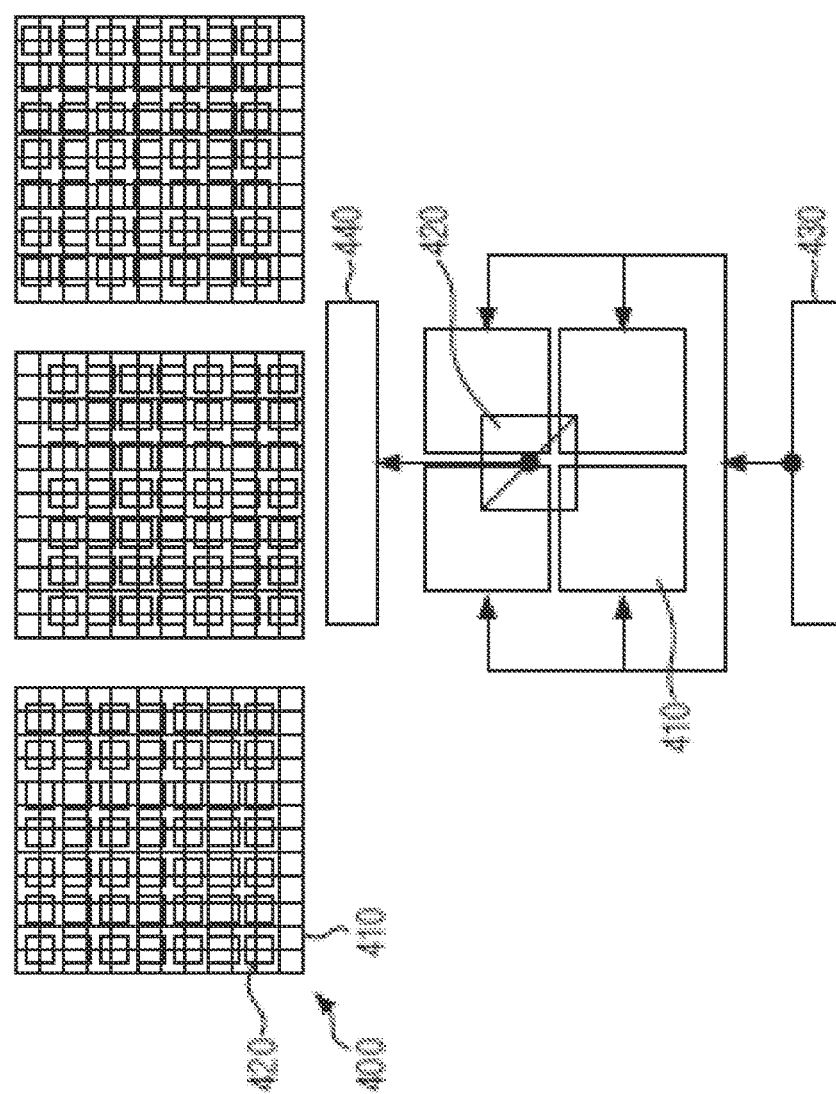
FIG. 5 illustrates alignment of optical transmitters and optical receivers formed in semiconductor dies.

FIG. 5 is one illustrative embodiment that shows a top view of an illustrative die 400 wherein macroscopic handshake alignment of optical transmitters 410 and optical receivers 420 may be performed. During the handshake alignment, it may be particularly determined which optical receivers 420 detect signals transmitted by which particular optical transmitters 410. In one illustrative example, alignment of optical transmitters and optical receivers of individual stacked dies may be performed physically based on conductive TSVs bumps. Subsequently, the plurality of die may be encapsulated and accurate alignment may be done on a software basis or by a suitably configured circuitry based on a handshake mechanism. For example, each of the optical transmitters 410 may transmit regular signals, for example, various regular checkerboards including irregular patterns, and an appropriate circuitry evaluates the signals received via some detector grid. Optical transmitters 410 and optical receivers 420 may be assigned to each other based on the determined best signal-response characteristics.

As illustrated in the bottom portion of FIG. 5, signal strengths may be optimized by assigning more than one optical transmitter to an optical receiver and using interference effects. A modulation circuitry 430 may be connected to individual optical transmitters 410 of an array of optical transmitters 410, and a detection circuitry 440 may be connected to a particular optical receiver 420 assigned for the detection of optical signals emitted from the array of optical transmitters 410. The modulation circuitry 430 may be configured to modulate the strengths of the individual signals transmitted by the optical transmitters 410 and/or the strength of a combined optical signal generated by the combined optical signals transmitted by the optical transmitters 410. Particularly, the modulation circuitry 430 may have multiplexing capabilities.

Figure 6:
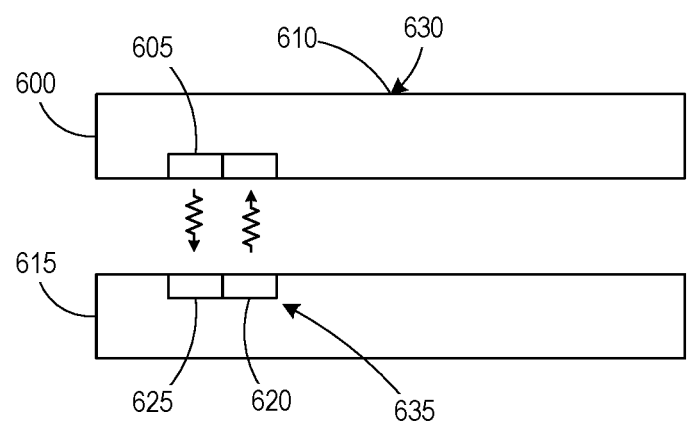
FIG. 6 illustrates two communicating semiconductor dies, each having optical transmitters and optical receivers.

FIG. 6 illustrates a first semiconductor die 600 with an optical transmitter 605 and an optical receiver 610 and a second semiconductor die 615 with an optical transmitter 620 and an optical receiver 625. The optical transmitter 605 transmits an optical signal to the optical receiver 625 of the second semiconductor die 615 and the optical receiver 610 receives an optical signal from the optical transmitter 620 of the second semiconductor die 615. The optical transmitter 605 and the optical receiver 610 may be part of a combined optical transceiver 630, and the optical transmitter 620 and the optical receiver 625 may be part of a combined optical transceiver 635.

As a result, a novel semiconductor device is provided comprising a plurality of stacked die that are equipped with optical transmitters and receivers. Signaling via the optical transmitters and receivers may be performed by one die to one or more other ones of the stacked dies. Reliable and fast communication of large amounts of data may thereby be realized. Moreover, the optical signaling does not result in undesired parasitic capacitances. In particular, the technique comprising the optical transmitters and receivers may be readily integrated with the techniques of signaling by means of electrical currents flowing through TSVs. The provided techniques may, in particular, be integrated in 14, 10 or 7 nm VLSI CMOS technologies.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method, comprising:
   forming a stack of semiconductor dies, said stack comprising a first semiconductor die, a second semiconductor die and a third semiconductor die, wherein said first semiconductor die is stacked above said second semiconductor die and said third semiconductor die is stacked above said first semiconductor die;
   providing a first optical transmitter and a first optical receiver positioned in said first semiconductor die, a second optical transmitter in said second semiconductor die, and a second optical receiver in said third semiconductor die;
   transmitting a first optical signal from said first optical transmitter in said first semiconductor die to said second optical receiver in said third semiconductor die; and
   transmitting a second optical signal from said second optical transmitter in said second semiconductor die to said first optical receiver in said first semiconductor die.

2. The method of claim 1, wherein said first semiconductor die further comprises at least one through-silicon via, and the method further comprises electrically connecting said first semiconductor die to at least one of said second semiconductor die and said third semiconductor die using said at least one through-silicon via.

3. The method of claim 1, wherein said second semiconductor die further comprises a plurality of conductive bumps formed on an upper surface thereof, said first semiconductor die comprises a semiconductor substrate and a plurality of through-silicon vias formed at least partly in said semiconductor substrate, and the method further comprises interfacing said plurality of through-silicon vias with said plurality of conductive bumps to electrically connect said second semiconductor die to said first semiconductor die.

4. The method of claim 1, wherein said first semiconductor die comprises a plurality of optical transmitters including said first optical transmitter, and the method further comprises modulating at least one of the strengths of optical signals transmitted by said plurality of said optical transmitters and the strength of an optical signal resulting from a combination of optical signals transmitted by said plurality of said optical transmitters.

5. The method of claim 1, wherein at least one of said first and second optical transmitters has one of an LCD, an LED and an organic LED and at least one of said first and second optical receivers has a photo diode.

6. The method of claim 1, wherein providing said first optical transmitter and said first optical receiver comprises providing a first optical transceiver comprising said first optical transmitter and said first optical receiver.

7. The method of claim 1, wherein providing said second optical transmitter comprises providing an optical transceiver comprising said second optical transmitter.

8. The method of claim 1, wherein providing said second optical receiver comprises providing an optical transceiver comprising said second optical receiver.

9. A method, comprising:
- stacking a plurality of semiconductor dies, wherein said plurality of semiconductor dies includes a first semiconductor die, a second semiconductor die positioned below said first semiconductor die, and a third semiconductor die positioned above said first semiconductor die, wherein said first semiconductor die comprises a plurality of optical transmitters;
- communicating a first optical signal between said first semiconductor die and said second semiconductor die;
- communicating a second optical signal between said first semiconductor die and said third semiconductor die; and
- modulating at least one of the strengths of optical signals transmitted by said plurality of said optical transmitters and the strength of an optical signal resulting from a combination of optical signals transmitted by said plurality of said optical transmitters.

10. The method of claim 9, wherein said second semiconductor die further comprises a plurality of conductive bumps formed on an upper surface thereof, said first semiconductor die comprises a semiconductor substrate and a plurality of through-silicon vias formed at least partly in said semiconductor substrate, and the method further comprises interfacing said plurality of through-silicon vias with said plurality of conductive bumps to electrically connect said second semiconductor die to said first semiconductor die.

11. The method of claim 9, further comprising:
- providing a first optical transmitter of said plurality of optical transmitters and a first optical receiver positioned in said first semiconductor die, a second optical transmitter in said second semiconductor die, and a second optical receiver in said third semiconductor die;
- transmitting a first optical signal from said first optical transmitter in said first semiconductor die to said second optical receiver in said third semiconductor die; and
- transmitting a second optical signal from said second optical transmitter in said second semiconductor die to said first optical receiver in said first semiconductor die.

12. The method of claim 11, wherein at least one of said first and second optical transmitters has one of an LCD, an LED and an organic LED and at least one of said first and second optical receivers has a photo diode.

13. The method of claim 11, wherein providing said first optical transmitter and said first optical receiver comprises providing a first optical transceiver comprising said first optical transmitter and said first optical receiver.

14. The method of claim 11, wherein providing said second optical transmitter comprises providing an optical transceiver comprising said second optical transmitter.

15. The method of claim 11, wherein providing said second optical receiver comprises providing an optical transceiver comprising said second optical receiver.

\* \* \* \* \*